(12) United States Patent
Hong et al.

(10) Patent No.: US 8,264,807 B2
(45) Date of Patent: Sep. 11, 2012

(54) START-UP IN-RUSH CURRENT PROTECTION CIRCUIT FOR DCDC CONVERTER

(75) Inventors: Wee Sien Hong, Singapore (SG); Jiong Fu, Singapore (SG); Andi Soemarli Rasak Lie, Singapore (SG)

(73) Assignees: Panasonic Corporation, Osaka (JP); Panasonic Semiconductor Asia Pte. Ltd., Singapore (SG)

( * ) Notice: Subject to any disclaimer, the term of this patent is extended or adjusted under 35 U.S.C. 154(b) by 386 days.

(21) Appl. No.: 12/732,295

(22) Filed: Mar. 26, 2010

(65) Prior Publication Data
US 2011/0234184 A1  Sep. 29, 2011

(51) Int. Cl.
*H02H 3/20* (2006.01)
*H02H 9/04* (2006.01)
*G05F 1/00* (2006.01)

(52) U.S. Cl. ...................................... 361/91.5; 323/282
(58) Field of Classification Search ................... 361/91.5
See application file for complete search history.

(56) References Cited

U.S. PATENT DOCUMENTS

| | | | |
|---|---|---|---|
| 5,818,214 A * | 10/1998 | Pelly et al. | 323/351 |
| 6,320,449 B1 * | 11/2001 | Capici et al. | 327/435 |
| 6,587,356 B2 | 7/2003 | Zhu et al. | |
| 6,614,668 B2 | 9/2003 | Coffey et al. | |
| 7,158,352 B2 * | 1/2007 | Sasaki et al. | 360/322 |
| 7,203,048 B2 | 4/2007 | Shyr et al. | |
| 7,420,355 B2 * | 9/2008 | Liu et al. | 323/271 |
| 7,977,929 B2 * | 7/2011 | Turchi et al. | 323/283 |
| 7,990,123 B2 * | 8/2011 | Lim et al. | 323/283 |
| 2009/0115465 A1 | 5/2009 | Garcia et al. | |
| 2009/0243579 A1 | 10/2009 | Lim et al. | |
| 2010/0156372 A1 * | 6/2010 | Kobayashi et al. | 323/282 |

OTHER PUBLICATIONS

"Linear and Switching Voltage Regulator Fundamentals", Chester Simpson, pp. 1-62.
U.S. Appl. No. 12/732,285 to TAN et al., filed Mar. 26, 2010.
U.S. Appl. No. 12/732,292 to HONG et al., filed Mar. 26, 2010.

* cited by examiner

*Primary Examiner* — Dharti Patel
(74) *Attorney, Agent, or Firm* — Greenblum & Bernstein P.L.C.

(57) ABSTRACT

A protection circuit for protecting DCDC converter with a power MOS transistor from start-up in-rush current includes a coupling capacitor and a voltage clamping circuit. By using the coupling capacitor to turn-off the power MOS transistor, there is no current consumed during the normal operation of the circuit. Enable signal or leakage current circuit is used to discharge the capacitor so that the circuitry can work in another turning-on of power supply.

15 Claims, 6 Drawing Sheets

START-UP IN-RUSH CURRENT PROTECTION CIRCUIT FOR DCDC CONVERTER

BACKGROUND OF THE INVENTION

The present invention relates to a start-up in-rush current protection circuit for DCDC converter, making use of capacitor and voltage clamping circuitry.

Typically, a DCDC converter is a device to control an external power MOS transistor to produce a certain regulated DC voltage. The external power MOS transistor is controlled by a signal from a driver block. The power MOS acts as a switch, turning on and off according to the driver signal which controls the gate of the power MOS transistor.

The driver block is usually turned-on by an Enable signal. During start-up, when power supply voltage rises, the driver block may have not been enabled. Due to parasitic capacitances of the power MOS transistor, it is possible to happen that the gate voltage of the power MOS transistor can not follow the fast rising of power supply voltage. This causes the output voltage to rise to a high voltage. This event may destroy the components connected to output voltage of DCDC converter.

Conventionally, as shown in FIG. 1, this problem is avoided by connecting a resistor $R_p$ between the drain and gate of the power MOS transistor so that the gate voltage may follow the power supply voltage.

There are two drawbacks with the conventional circuit. The first drawback is that there is still possibility for the gate voltage to not follow the power supply voltage, especially when the resistance value of resistor $R_p$ is large. The second drawback is that there is constant current consumed by the resistor after driver block is enabled. This current may be large if the resistance value of resistor Rp is small.

SUMMARY OF THE INVENTION

The purpose of this invention is to turn-off external power MOS transistor of DCDC converter while avoiding the two drawbacks mentioned in previous section.

The present invention makes use of capacitors and voltage clamping circuitry to turn-off the external power MOS transistor.

According to the present invention, a start-up in-rush current protection circuit for a DCDC converter with an output stage circuit having a power transistor, an inductor and a smoothing capacitor connected in series between a power supply and a ground, the protection circuit comprises: a coupling capacitor having a first terminal connected to said power supply, a PMOS transistor having a drain terminal connected to a gate terminal of the power transistor, a source terminal connected to the power supply, and a gate terminal connected to the power supply; a first NMOS transistor having a drain terminal connected to a gate terminal of said PMOS transistor, a source terminal connected to ground, and a gate terminal connected to a second terminal of said coupling capacitor; and a driver block having an output terminal connected to said drain terminal of said PMOS transistor, for outputting voltage driving signals to the gate terminal of the DCDC converter power transistor.

DETAILED DESCRIPTION OF THE PREFERRED EMBODIMENTS

The following description explains the best mode embodiment of the present invention.

(First Embodiment)

Figure 1:
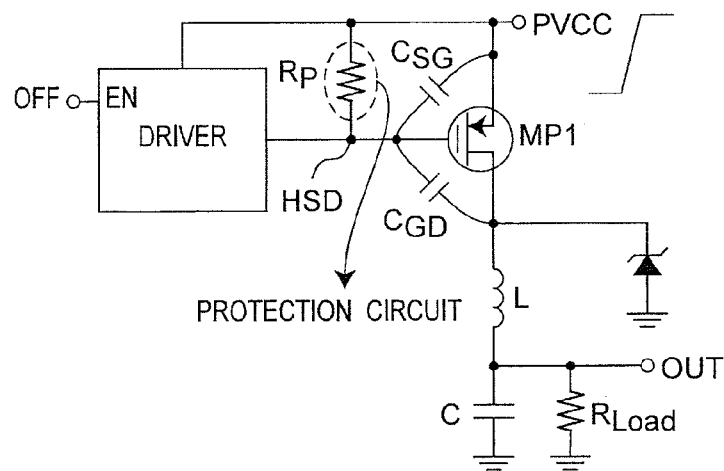
FIG. 1 is a block diagram showing the conventional circuitry to avoid in-rush current during start-up.
Figure 2A:
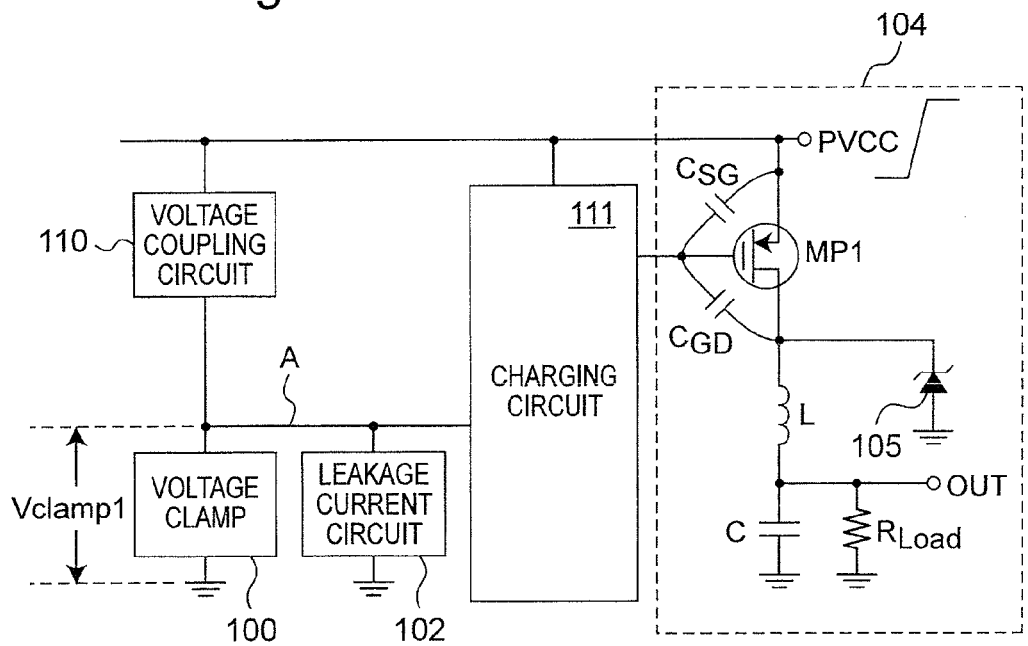
FIG. 2A is a block diagram showing the first embodiment of the present invention.

Referring to FIG. 2A, a first embodiment of a start-up in-rush current protection circuit according to the present invention is shown.

The start-up in-rush current protection circuit has an output stage circuit 104 for a DCDC converter which comprises a power PMOS transistor MP1, inductor L, zener diode 105, smoothing capacitor C and load $R_{load}$. Capacitances represented by $C_{SG}$ and $C_{GD}$ are parasitic capacitances present in power PMOS transistor MP1, effectively between the source and gate terminals, and between the drain and gate terminals respectively. Power supply (not shown) to the circuit is via terminal PVCC. A typical DCDC converter is disclosed for example in a published article by National Semiconductor: "Linear and Switching Voltage Regulator Fundamentals" on page 34, which is herein incorporated by reference. The article "Linear and Switching Voltage Regulator Fundamentals" can be obtained from the following URLs.

http://www.national.com/appinfo/power/files/f4.pdf
http://www.national.com/appinfo/power/files/f5.pdf The former covers pages 1-29, and the latter covers pages 30-62.

According to the first embodiment of the present invention, a start-up in-rush current protection circuit further has a voltage clamp 100, a voltage coupling circuit 110, a charging circuit 111 and a leakage current circuit 102.

The voltage clamp circuit 100 clamps the voltage of node A. The voltage coupling circuit 110 is connected to a power supply and node A. The voltage coupling circuit 110, which is according to one example formed by a capacitor, couples the power supply voltage at terminal PVCC to node A. The voltage at node A will be changed proportionally to the voltage of at terminal PVCC, and it is clamped by the voltage clamp circuit 100.

The charging circuit 111 is controlled by the voltage of node A. If voltage of node A is higher than a predetermined value, the charging circuit 111 charges the gate of output power transistor MP1 and turns off the output power transistor MP1. If voltage of node A is lower than the predetermined value, the charging circuit 111 will be de-activated.

The leakage current circuit 102 is added to discharge the voltage of the node A slowly to deactivate the charging circuit 111.

A further detail of the first embodiment is shown in FIGS. 2B, 3A, 3B and 4.

Figure 2B:
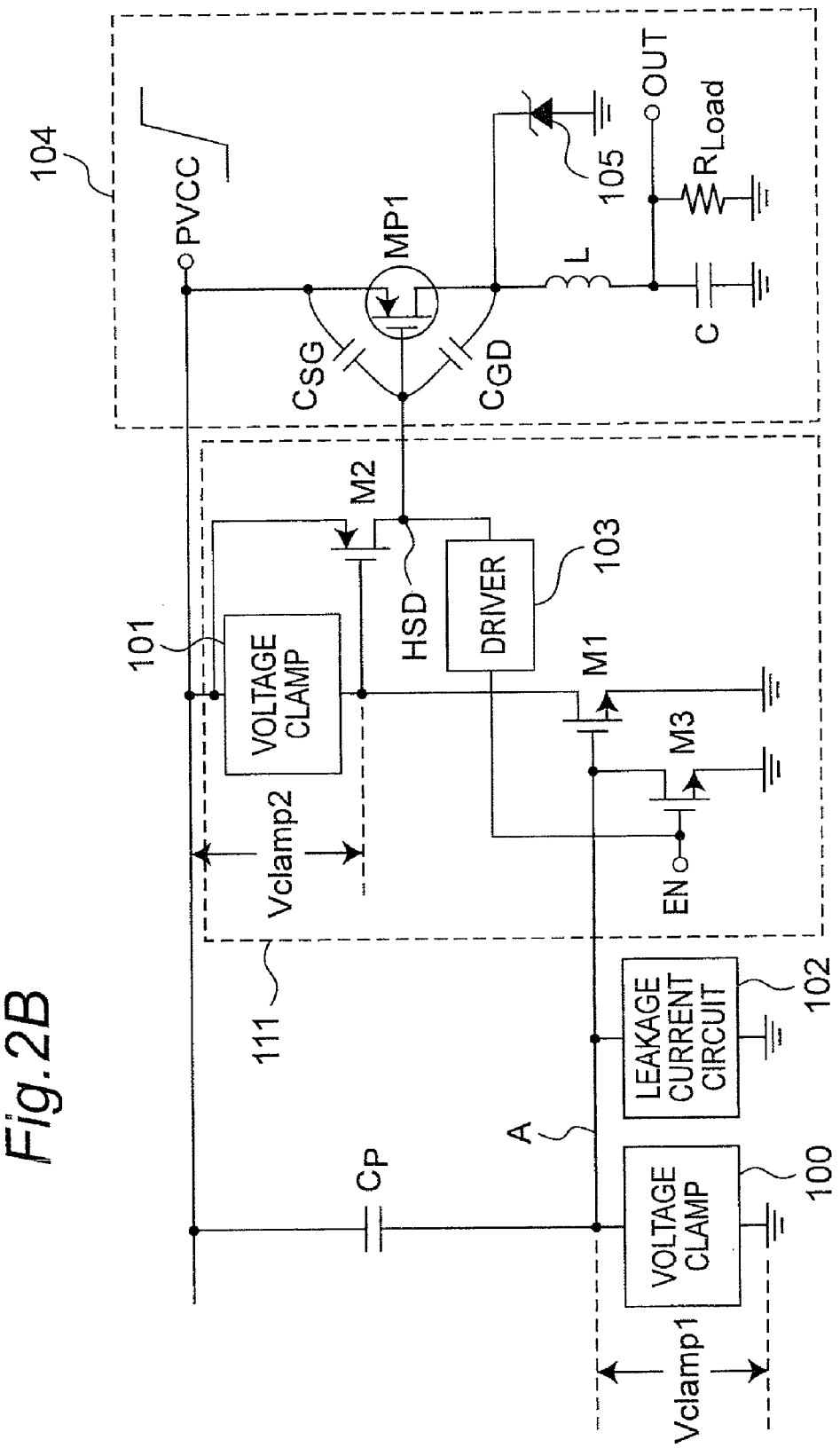
FIG. 2B is a block diagram showing an example circuit according to the first embodiment of the present invention.

As shown in FIG. 2B, the voltage coupling circuit 110 is formed by a coupling capacitor Cp.

Figure 2C:
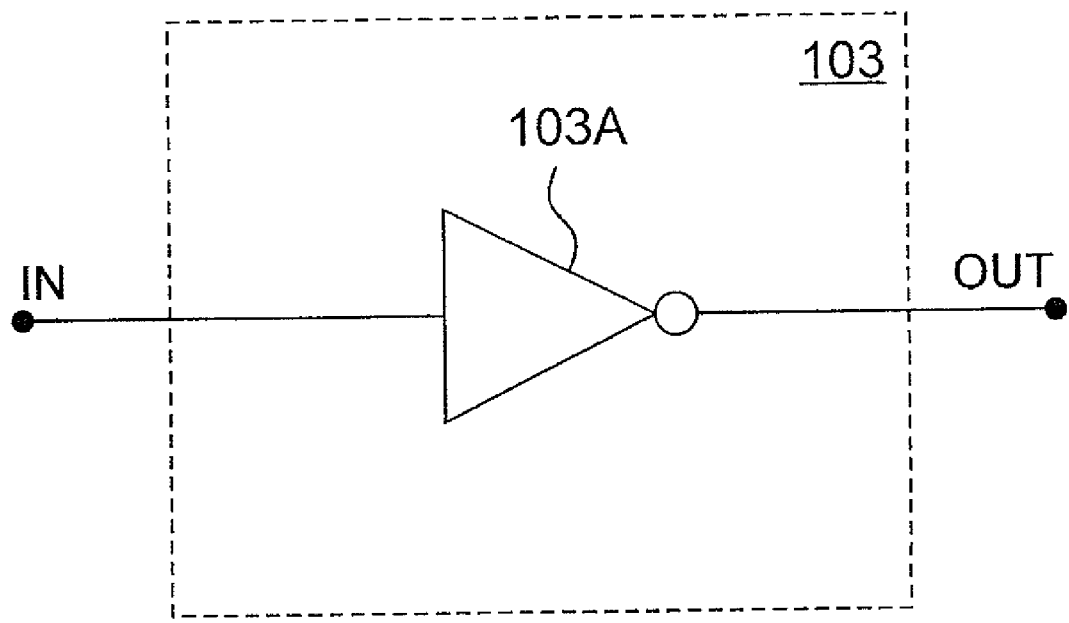
FIG. 2C is a circuit diagram showing an example of a circuit that can be used as a driver 103.

The charging circuit 111 has voltage clamp 101, NMOS transistor M1, PMOS transistor M2, driver 103, and NMOS transistor M3. The NMOS transistor M3 and the driver 103 are activated by an enable signal EN. Driver 103 is exemplarily represented by FIG. 2C. The driver 103 may exemplarily comprise of an inverter 103A, which is herein incorporated by reference.

Figure 3A:
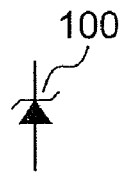
FIG. 3A is an example of a circuit element that can be used as a voltage clamp.

Voltage clamp 100 comprises, but not necessarily limited to, zener diode, as shown in FIG. 3A.

Figure 3B:
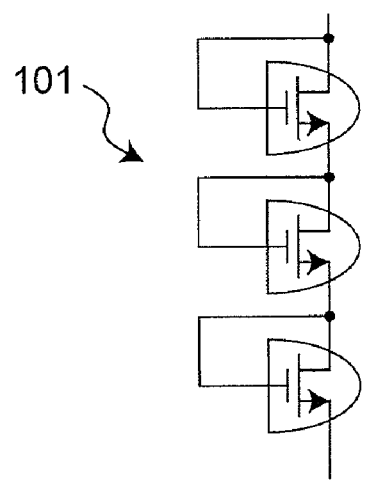
FIG. 3B is yet another example of a circuit that can be used as a voltage clamp.

Voltage clamp 101 comprise, but not necessarily limited to, diodes connected in series, as shown in FIG. 3B.

Figure 4:
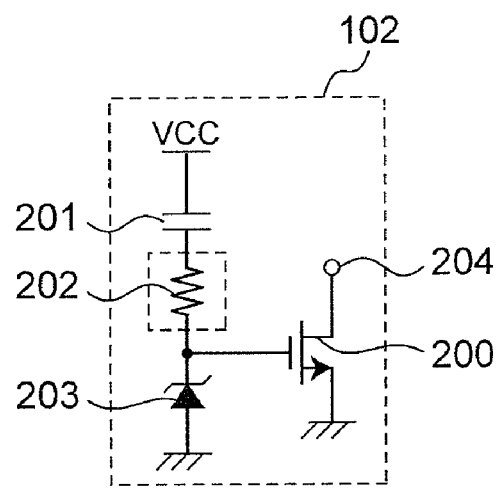
FIG. 4 is a circuit diagram showing an example of a circuit that can be used as a leakage current circuit.

As one example, leakage current circuit 102 is shown in FIG. 4. The Leakage current circuit 102 has a capacitor 201, resistor 202, zener diode 203 and NMOS transistor 200. Capacitor 201 has a capacitance which is at least twice the capacitance of $C_p$. The resistor 202 is an optional element, typically used for ESD protection, and may not necessarily be included. Also, the W/L ratio of NMOS transistor 200 is very small, so as to cause NMOS transistor 200 to sink small amount of current per unit time.

The operation of the first embodiment of the present invention is now described based on an exemplary implementation as shown in FIG. 2B.

Upon circuit start-up, the voltage at terminal PVCC rises. Via capacitor $C_P$, gate voltage of NMOS transistor M1 will be charged to Vclamp1 (the voltage determined by the Voltage Clamp 100). This turns NMOS transistor M1 on. Voltage clamp 100 is connected to the gate of NMOS transistor M1 so that NMOS transistor M1 is protected from VGS breakdown.

When NMOS transistor M1 is turned on, gate voltage of PMOS transistor M2 becomes (PVCC−Vclamp2), thus turning PMOS transistor M2 on. Voltage clamp 101 is inserted between the gate and source of PMOS transistor M2 so that PMOS transistor M2 is protected from VSG breakdown.

Since PMOS transistor M2 is turned on, the voltage at node HSD is short circuited to PVCC voltage, avoiding the turning on of power PMOS transistor MP1. Thus, the power PMOS transistor MP1 is protected from the in-rush current.

Leakage current circuit 102 is a circuitry that constantly draws small current. It helps to gradually discharge the gate of NMOS transistor M1 so that the gate voltage of NMOS transistor M1 falls low enough to cause NMOS transistor M1 to turn off. This in turn turns off PMOS transistor M2. When this happens, the gate terminal of power PMOS transistor MP1 will no longer be tied to the PVCC voltage.

Figure 6:
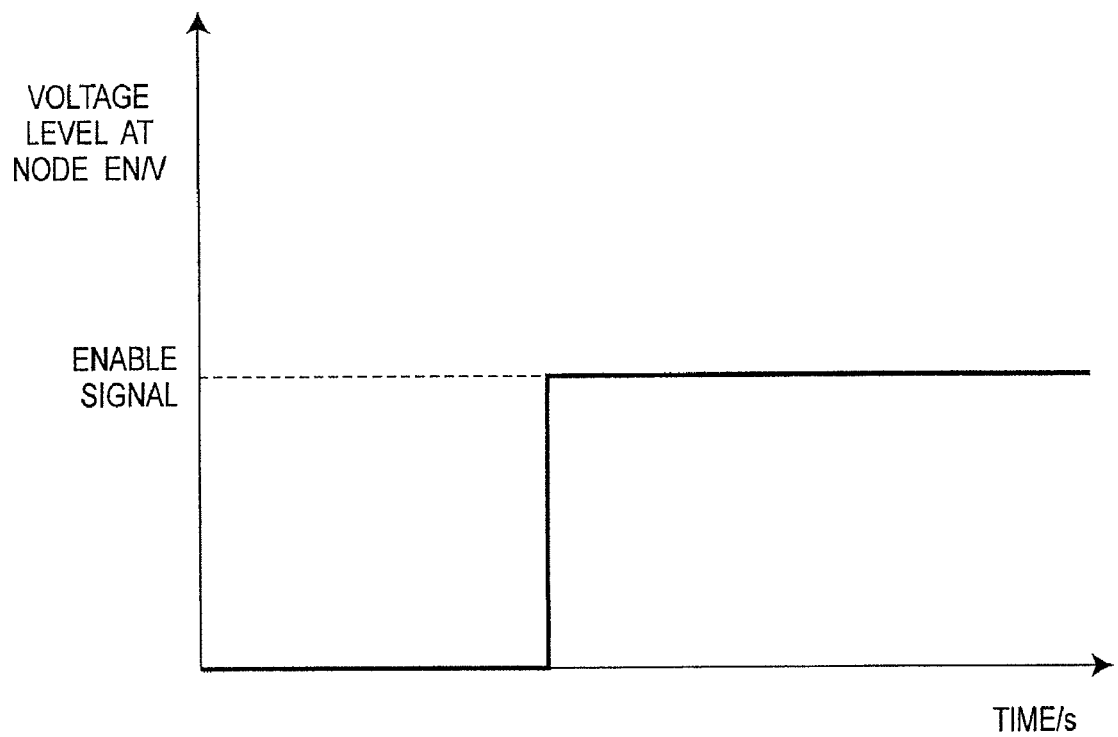
FIG. 6 is an example of a waveform showing the generation of the Enable signal at node EN.

When the user desires to enable power PMOS transistor MP1, an enable signal is generated at node EN, as shown in FIG. 6.

NMOS transistor M3 functions as a switch to discharge the gate of NMOS transistor M1. When Enable signal is generated at node EN, NMOS transistor M3 turns on, and subsequently, turns off NMOS transistor M1 and PMOS transistor M2. The same Enable signal generated at node EN also turns on Driver block 103, whose output terminal is coupled to the gate terminal of the power PMOS transistor MP1. Therefore, Driver block 103 will take over control of the operation of power PMOS transistor MP1.

The protection circuit is now ready to work in the next turning on of the IC.

(Second Embodiment)

Figure 5:
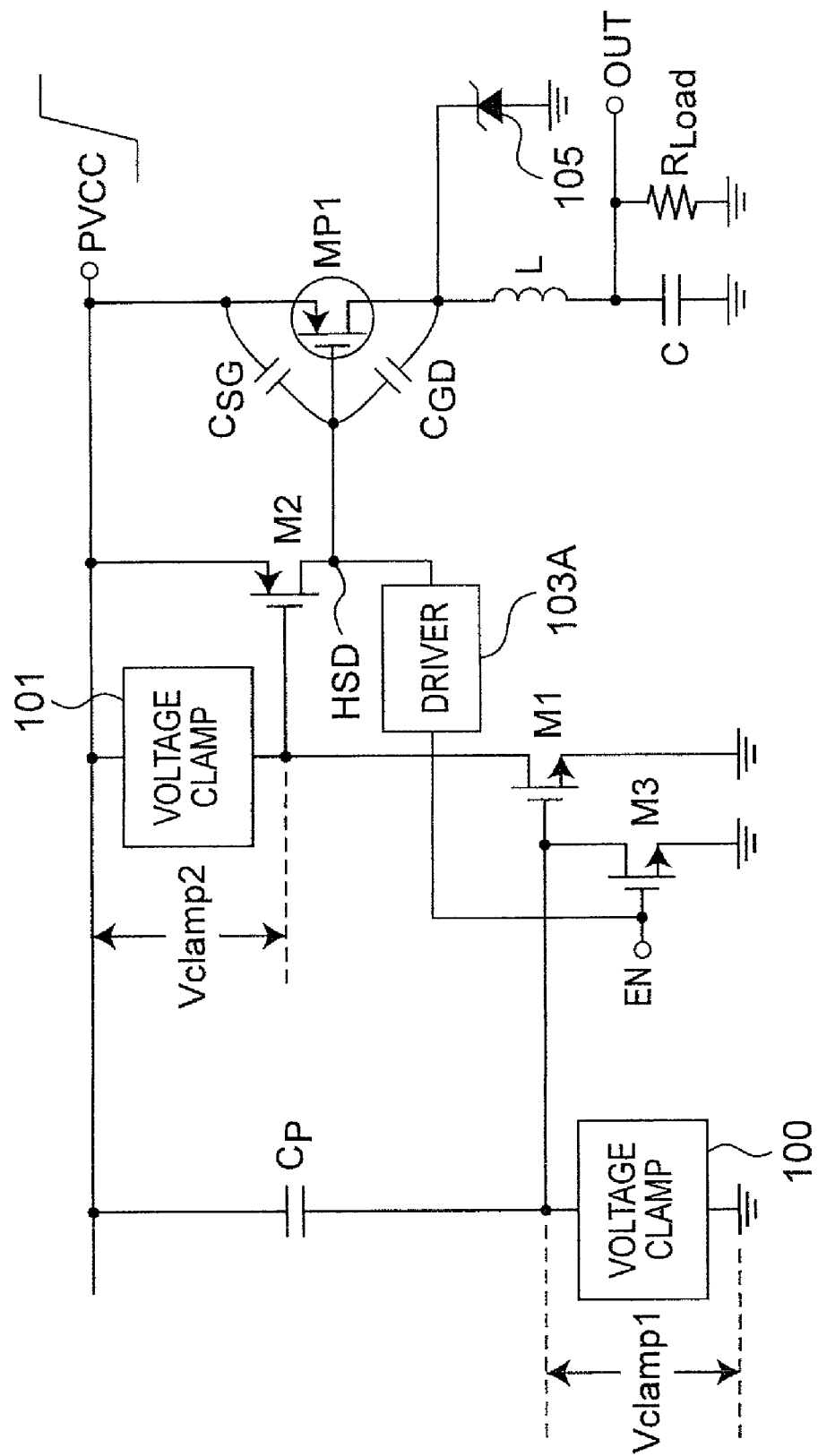
FIG. 5 is a block diagram showing the second embodiment of the present invention.

A second embodiment of this invention is shown in FIG. 5. Here, instead of the leakage current circuit 102, an NMOS transistor M3 is used. At the instance when the user wishes the driver block 103 to take over control of power PMOS transistor MP1, a signal is sent to both NMOS transistor M3 and the driver block 103 so as to cause both NMOS transistor M3 and driver block 103 to be enabled. The signal is sent to the driver block 103 via an 'Enable' terminal 103A. The enabling of NMOS transistor M3 causes NMOS transistor M1 and PMOS transistor M2 to be disabled. This allows power PMOS transistor MP1 to be controlled by driver block 103. Typically, the Enable signal generated at node EN is a HIGH signal, as shown in FIG. 6.

Although the present invention has been described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims, unless they depart therefrom.

What is claimed is:

1. A start-up in-rush current protection circuit for a DCDC converter with an output stage circuit having a power transistor, an inductor and a smoothing capacitor connected in series between a power supply and a ground, the protection circuit comprising:
    a coupling capacitor having a first terminal connected to said power supply,
    a PMOS transistor having a drain terminal connected to a gate terminal of the power transistor, a source terminal connected to the power supply, and a gate terminal connected to the power supply;
    a first NMOS transistor having a drain terminal connected to a gate terminal of said PMOS transistor, a source terminal connected to ground, and a gate terminal connected to a second terminal of said coupling capacitor; and
    a driver block having an output terminal connected to said drain terminal of said PMOS transistor, for outputting voltage driving signals to the gate terminal of the DCDC converter power transistor.

2. The start-up in-rush current protection circuit for a DCDC converter according to claim 1, wherein said power transistor is a power PMOS transistor.

3. A start-up in-rush current protection circuit for a DCDC converter according to claim 2, further comprising a first voltage clamp connected between said gate terminal of said PMOS transistor and said power supply.

4. A start-up in-rush current protection circuit for a DCDC converter according to claim 3, further comprising a second voltage clamp connected between said gate terminal of said first NMOS transistor and ground.

5. A start-up in-rush current protection circuit for a DCDC converter according to claim 4, wherein said first voltage clamp comprises a zener diode.

6. A start-up in-rush current protection circuit for a DCDC converter according to claim 4, wherein said first voltage clamp comprises one or more diodes connected in series.

7. A start-up in-rush current protection circuit for a DCDC converter according to claim 4, wherein said second voltage clamp comprises a zener diode.

8. A start-up in-rush current protection circuit for a DCDC converter according to claim 4, wherein said second voltage clamp comprises one or more diodes connected in series.

9. A start-up in-rush current protection circuit for a DCDC converter according to claim 4, further comprising:
    a leakage current circuit connected to said gate terminal of said first NMOS transistor.

10. A start-up in-rush current protection circuit for a DCDC converter according to claim 9, wherein said leakage current circuit comprises:
    a second NMOS transistor, the source terminal connected to ground, the drain terminal connected to said gate terminal of said first NMOS transistor, and the gate terminal connected to ground via a zener diode;

a second capacitor having a first terminals connected to said power supply;

a resistor having a first terminal connected to said second terminal of said second capacitor, and a second terminal connected to the gate terminal of said second NMOS transistor; and a zener diode, an anode connected to said gate terminal of said second NMOS transistor, and a cathode connected to ground.

11. A start-up in-rush current protection circuit for a DCDC converter according to 10, wherein said second NMOS transistor has a W/L ratio sufficiently large to cause a low rate of current pull to ground.

12. A start-up in-rush current protection circuit for a DCDC converter according to 10, wherein said second capacitor has a capacitance which is equal to or greater than twice the capacitance of said coupling capacitor.

13. A start-up in-rush current protection circuit for a DCDC converter according to claim 4, wherein said driver block has an enable terminal to cause said driver block to be enabled or disabled, and said protection circuit further comprising:

a third NMOS transistor having a drain terminal connected to said gate terminal of said first NMOS transistor, a gate terminal connected to said enable terminal of said driver block, and a source terminal connected to ground.

14. A start-up in-rush current protection circuit for a DCDC converter with an output stage circuit having a power transistor, an inductor and a smoothing capacitor connected in series between a power supply and a ground, the protection circuit comprising:

a voltage coupling circuit connect between said power supply and a node A;

a voltage clamp circuit connected between said node A and ground;

said voltage coupling circuit providing a voltage level of the power supply to said node A so that the voltage of node A changes proportionally to the voltage of power supply until the voltage is clamped by said voltage clamp circuit;

a charging circuit controlled by the voltage of node A such that when the voltage of node A increases higher than a predetermined value, said charging circuit charges a gate of said power transistor to turn off said power transistor, and when the voltage of node A decreases lower than the predetermined value, said charging circuit is de-activated.

15. The start-up in-rush current protection circuit for a DCDC converter according to claim 14, further comprising an additional leakage current circuit between the node A and ground so as to discharge the voltage at node A slowly.

\* \* \* \* \*